United States Patent [19]
Pascucci

[11] Patent Number: 5,864,503
[45] Date of Patent: Jan. 26, 1999

[54] METHOD FOR VERIFYING ELECTRICALLY PROGRAMMABLE NON-VOLATILE MEMORY CELLS OF AN ELECTRICALLY PROGRAMMABLE NON-VOLATILE MEMORY DEVICE AFTER PROGRAMMING

[75] Inventor: Luigi Pascucci, Sesto San Giovanni, Italy

[73] Assignee: SGS-Thomson Microelectronics S.r.l., Agrate Brianza, Italy

[21] Appl. No.: 866,531

[22] Filed: May 30, 1997

[51] Int. Cl.$^6$ .................................................. G11C 16/06
[52] U.S. Cl. ................................. 365/185.22; 365/185.2
[58] Field of Search ........................... 365/185.2, 185.21, 365/185.22, 185.25

[56] References Cited

U.S. PATENT DOCUMENTS

| | | | |
|---|---|---|---|
| 5,396,467 | 3/1995 | Liu | 365/185.21 |
| 5,524,094 | 6/1996 | Nobukata | 365/185.21 |
| 5,559,737 | 9/1996 | Tanaka | 365/185.25 |

*Primary Examiner*—Son Mai
*Attorney, Agent, or Firm*—Wolf, Greenfield & Sacks, P.C.

[57] ABSTRACT

A method for verifying an electrically programmable non-volatile memory cell of an electrically programmable memory device after programming, providing for accessing the memory cell after having submitted the same to at least a programming pulse by means of a sensing circuit, checking an output of the sensing circuit, and submitting said memory cell to further programming pulses if said output of the sensing circuit corresponds to a non-programmed memory cell. The checking an output of the sensing circuit is performed at a first instant of time which is anticipated of a prescribed time interval with respect to a second instant of time at which said output of the sensing circuit is checked in a normal read operation of the memory device, said prescribed time interval corresponding to a prescribed security margin of programming of the memory cell. (FIGS. 2 and 4).

40 Claims, 8 Drawing Sheets

5,864,503

METHOD FOR VERIFYING ELECTRICALLY PROGRAMMABLE NON-VOLATILE MEMORY CELLS OF AN ELECTRICALLY PROGRAMMABLE NON-VOLATILE MEMORY DEVICE AFTER PROGRAMMING

DESCRIPTION

1. Field of the Invention

The present invention relates to electrically programmable non-volatile memory devices, such as for example EPROMs, Flash-EEPROMs, EEPROMs. More particularly, the invention relates to a method for verifying the memory cells of such devices after programming.

2. Background of the Invention

In the art of electrically programmable memory devices, it is known that a programming operation of the memory cells provides for applying to the memory cells to be programmed a series of short programming pulses; after each programming pulse, the state of the memory cells is verified to ascertain if they are programmed or not; if yes, those memory cells which passed the test are no more applied the programming pulses; if no, a further programming pulse is applied to the memory cells, and this sequence of programming pulses and verifying steps goes on until all the memory cells to be programmed pass the verifying step.

Methods for verifying the programming state of the memory cells are known which in some way provides for deliberately worsening the operating conditions of the memory cells with respect to the specified operating conditions in which the memory cells would operate. In this way, if the memory cells are not programmed with a sufficient security margin they are detected as non-programmed, and further programming pulses will be applied to them. These methods are referred to as "Margin Mode™" verifying methods.

The known Margin Mode™ verifying methods affect the comparation voltage levels of the sensing circuits which senses the state of the memory cells. An example of sensing circuit is shown in FIG. 1, and will be hereinafter described to explain the operating principle of the known Margin Mode™ methods. The sensing circuit ("sense amplifier"), which is integrated in the memory device, comprises a first circuit branch 100 coupled to a bit line BLM of a memory matrix containing the memory cell 1 to be verified, and a second circuit branch 101 coupled to a reference bit line BLR containing a reference memory cell 1' which in a well-known programming state, typically in the non-programmed state; the memory cell 1 and the reference memory cell 1' are connected to a same word line WL of the matrix. Each branch 100, 101 comprises a respective conventional regulator 2 which sets the drain voltage of cells 1, 1' respectively. In series to each regulator 2, a respective load is provided comprised of a P-channel MOSFET 60, 70 with source tied to the supply voltage VDD. MOSFETs 60 and 70 have gate tied to drain, i.e. they operate in saturated condition. An N-channel MOSFET 8 connects together the two bit lines BLM, BLR, and is controlled by a signal PCn switching between ground and VDD. The drains of 60 and 70 forms the output signals O, ON of the sense amplifier, and are supplied to a comparator 102. Signal PCn is generated by a timing circuit T.

Signal PCn is a pre-charge signal activated at the beginning of a read operation of the memory cell 1, before the word line signal WL is activated; PCn turns MOSFET 8 on and thus equalizes the potentials of bit lines BLM and BLR. After signal PCn is deactivated, the voltage of the word line WL is raised to the supply voltage VDD, and the potentials of the bit lines BLM and BLR can from now on evolve according to the programming state of the memory cells 1 and 1', respectively, i.e. on the amount of current the cells conduct; the reference cell 1' is in a well-known state, non-programmed, so it conducts current; cell 1 under examination conducts a current which is lower the more the cell is programmed (if cell 1 is sufficiently programmed, it does not conduct current at all). The potentials of nodes O and ON evolve according to the evolution of signals BLM and BLR, and comparator 102 detects the umbalancing of signals O and ON. Loads 60 and 70 have different aspect ratios (typically, the aspect ratio of MOSFET 70 is twice the aspect ration of MOSFET 60), so that even when memory cell 1 is non-programmed and thus conducts a current substantially equal to that sunk by reference cell 1' the potential of nodes O and ON is different (node O lower than node ON).

In a normal read operation, the voltage VDD falls within a specified range of values, for example 5 V±10% or 3 V±10%. The whole memory device, included the sense amplifier, is designed to assure proper working in said specified ranges of supply voltages. A memory cell 1 which is not sufficiently programmed could, when it is accessed (VDD applied to its control electrode), sinks a current sufficiently high to cause the potential of node O to drop below that of node ON, and be read as a non-programmed cell. So, it is necessary to verify the effective programming level of the memory cells after they have been applied to a programming pulse.

One known Margin Mode™ verify method provides for verifying the programming state of the memory cells by performing a read operation at a supply voltage VDD higher than the maximum specified working supply voltage; in this way, the voltage applied to the gate of the memory cells is higher, and memory cells which are not programmed with a sufficient security margin conduct current and are therefore read as non-programmed; a further programming pulse is then applied to said cells.

Another known verify method provides for varying the aspect ratios of the load MOSFET 60 and 70 with respect to that in normal reading conditions (for example, the aspect ratio of MOSFET 70 is made three times higher than that of MOSFET 60; this can be achieved by shunting MOSFET 70 with another P-channel MOSFET having the same aspect ratio of MOSFET 60), so that even for a lower current in branch 100 the potential of node O falls below that of node ON, and the memory cell 1 is read as non-programmed; again, a further programming pulse is then applied to such a cell.

These two methods could also be combined, so that verifying of the memory cells is performed by rising the supply voltage VDD and changing the aspect ratio of loads MOSFETs 60, 70.

Thanks to the these methods, it is possible to assure that the memory cells are programmed with a sufficient security margin, so that in normal operating conditions the programmed memory cells are not read as non-programmed.

These methods are however affected by problems deriving from the fact that they are substantially static. A memory cell which after verifying is determined to be effectively programmed on the basis of the above-described static approach could actually be not sufficiently programmed to guarantee that, in normal operating conditions, the sense amplifier is capable of reading the information content thereof in a sufficiently short time: in fact, if cell 1 conducts a current, even if such a current is so small than in steady state the potential of node O does not fall below that of node ON, the time required for the potential of nodes O and ON to evolve to such steady state condition can be so high that the correct reading of the cell is not achieved in the prescribed time. This problem is exacerbated the higher the supply voltage, also because in this case the timings inside the memory devices are naturally accelerated, so that also the sense amplifier has to provide the correct read datum in a shorter time. Furthermore, slight loss of charge on the part of the memory cells (reducing their programming level), bumps on the voltage supply or ground, or in general noise, can cause said memory cells not be read correctly in the prescribed time.

The static Margin Mode™ verifying methods previously described can be completely unuseful for clocked memory devices with internal data sampling. An example of sensing circuit with data sampling is shown in FIG. 2. Load MOSFETs 6 and 7 are cross-coupled, i.e. the gate of 6 is connected to the drain of 7, and vice-versa. Two cross-coupled N-channel MOSFETs 10, 11 are connected to the drains of 6 and 7, respectively, the gate of 10 connected to the drain of 7 and the gate of 11 connected to the drain of 6. The sources of 10 and 11 are commonly connected to a signal EQ (generated by timing circuit T) switchable between ground and a voltage at least equal to VDD, signal EQ further controlling an N-channel MOSFET 12 connecting the drains of 6 and 7 together. At the output of comparator 102, a switch SW, controlled by a signal SAMPLE, selectively connects the output of comparator 102 to, e.g., a flip-flop FF, which in turn supplies an output data terminal of the memory device.

With reference to FIG. 3, signal EQ is activated substantially simultaneously to signal PCn to turn MOSFET 12 on and thus equalizing the potentials of nodes O and ON. After signal PCn is deactivated and signal WL is raised to VDD, the potential of the bit lines BLM, BLR evolves depending on the currents sunk by cells 1 and 1'. When signal EQ is deactivated, MOSFET 12 is turned off and the potentials of nodes O and ON, no more equalized, can evolve independently according to the voltage of BLM and BLR, respectively. Switching of signal EQ to ground also provides a ground connection for the sources of MOSFETs 10 and 11, so that the latter form, together with MOSFETs 6 and 7, a latch structure. When the potentials of nodes O and ON have sufficiently separated, the latch structure triggers to store the datum. If cell 1 is sufficiently programmed, the potential spread between bit lines BLM and BLR causes the latch structure to switch quickly and correctly. When signal SAMPLE is activated, a correct datum is transferred and loaded into flip-flop FF. If instead the cell 1 is not well programmed, the time lapse between the activation of signal WL and the deactivation of signal EQ could not be sufficient to determine a sufficient spread of potentials of BLM and BLR, so that after signal EQ is deactivated the potentials of nodes O and ON remain substantially similar and the datum captured by the latch structure is totally unreliable. When signal SAMPLE is activated, the output of comparator 102 is not yet ready to provide a correct datum, and flip-flop FF stores a wrong datum. Thus, a memory cell which only in steady-state conditions can be considered programmed can be erroneously read as non-programmed. As a consequence, the static Margin Mode™ verifying methods are not reliable. Additionally, noise and possible supply voltage over/under shoots can modify the instantaneous biasing conditions of the cells and the sensing circuit, again causing an erroneous reading of the memory cells not well programmed.

SUMMARY OF THE INVENTION

In view of the above, it is an object of the present invention that of providing a method for verifying the programming state of the memory cells which overcomes the above-mentioned drawbacks of the known static verifying method.

According to the present invention, such object is achieved by means of a method for verifying an electrically programmable non-volatile memory cell of an electrically programmable memory device after programming, providing for accessing the memory cell after having submitted the same to at least a programming pulse by means of a sensing circuit, checking an output of the sensing circuit, and submitting said memory cell to further programming pulses if said output of the sensing circuit corresponds to a non-programmed memory cell, characterized in that said checking an output of the sensing circuit is performed at a first instant of time which is anticipated of a prescribed time interval with respect to a second instant of time at which said output of the sensing circuit is checked in a normal read operation of the memory device, said prescribed time interval corresponding to a prescribed security margin of programming of the memory cell.

BRIEF DESCRIPTION OF THE DRAWINGS

FIG. 12 is a timing diagram of signals generated by said fourth circuit block.

DETAILED DESCRIPTION OF A PREFERRED EMBODIMENT

The method of the present invention will be described in connection with the data sampling sensing circuit shown in FIG. 2. However, this is not to be intended as a limitation, since the method can be straightforwardly applied to memory devices incorporating static sensing circuits of the type shown in FIG. 1.

Figure 2:
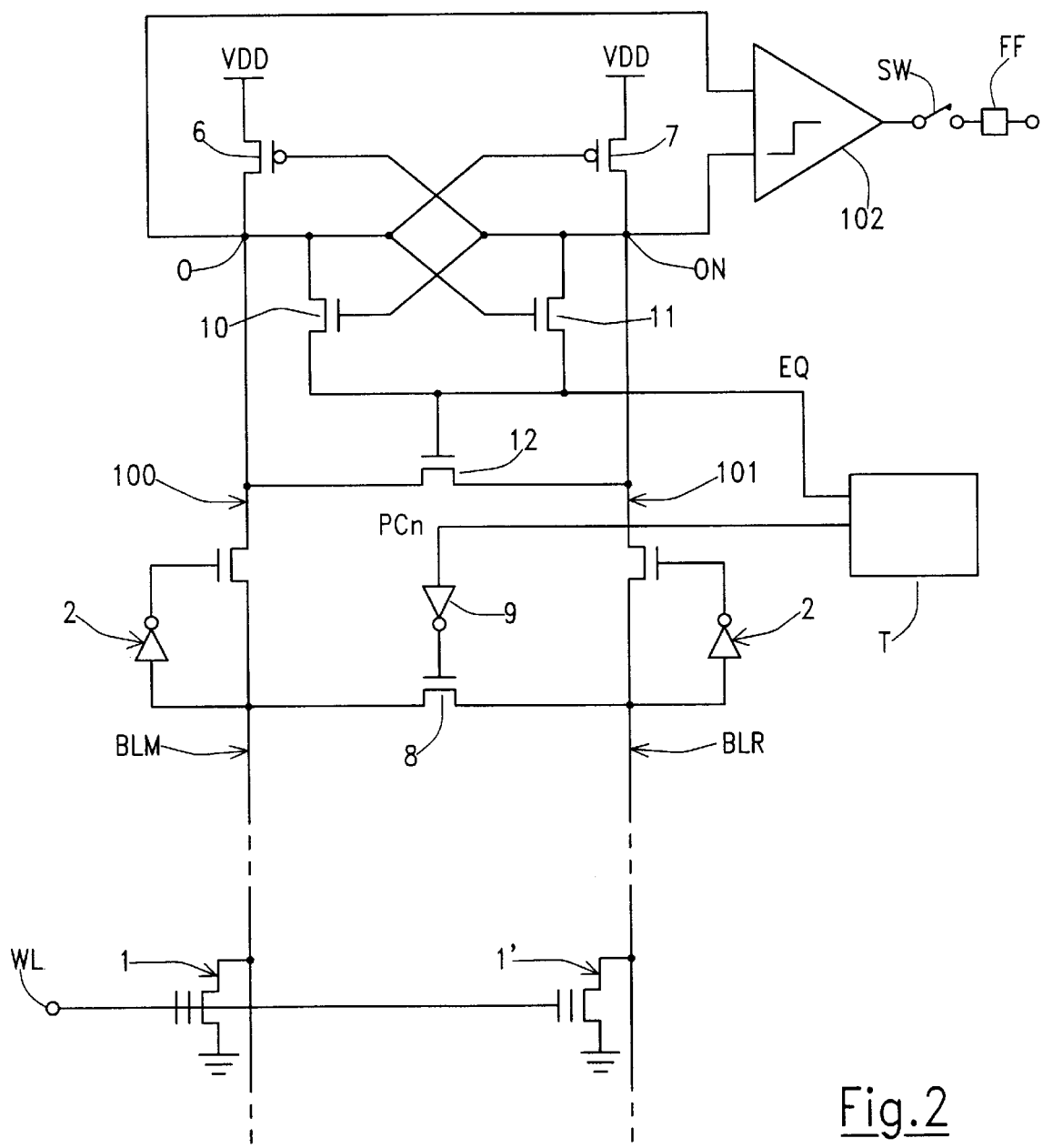
FIG. 2 is a circuit diagram of a known data sampling memory cell sensing circuit.
Figure 3:
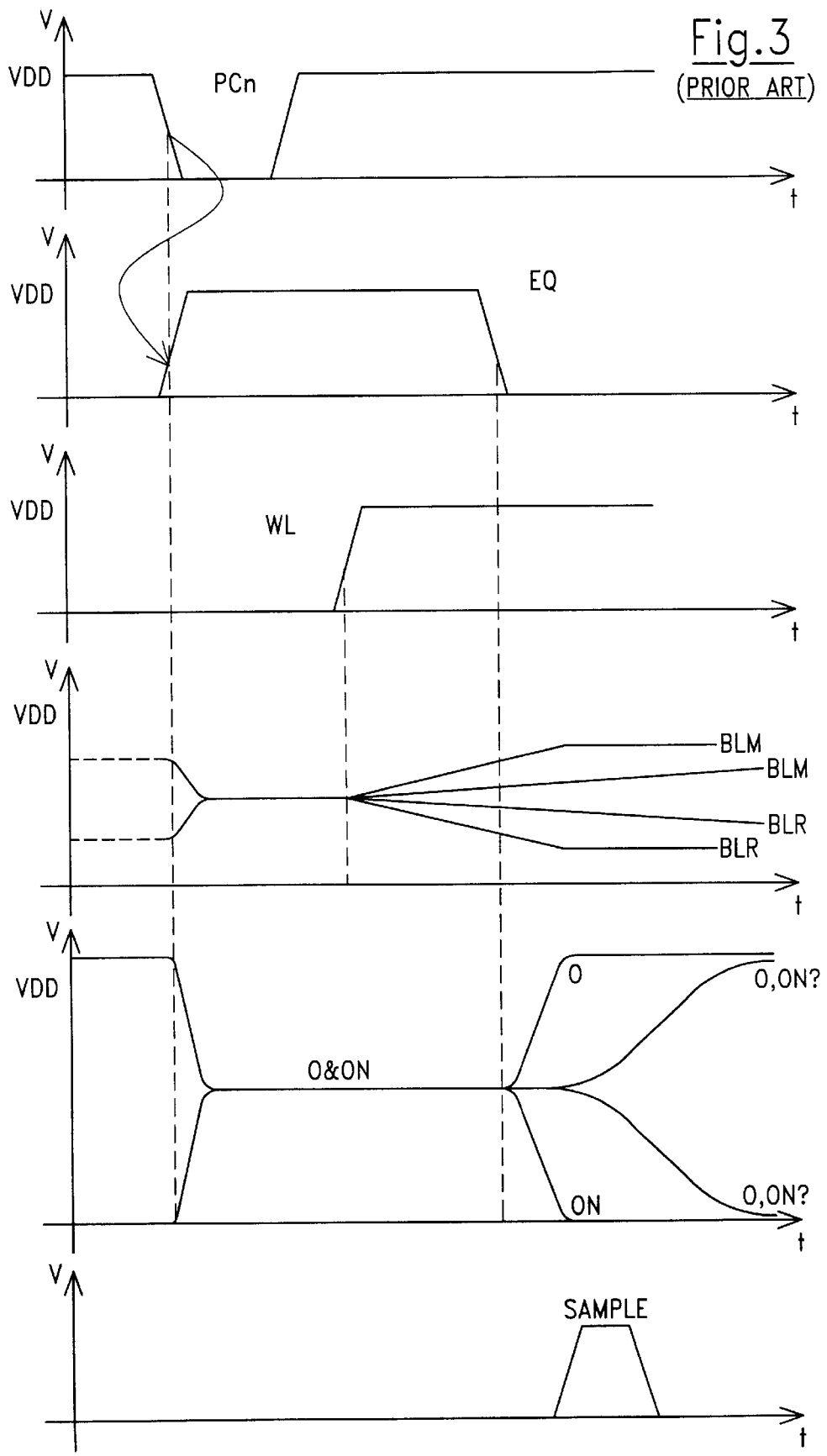
FIG. 3 is a timing diagram relating to the sensing circuit of FIG. 2.
Figure 4:
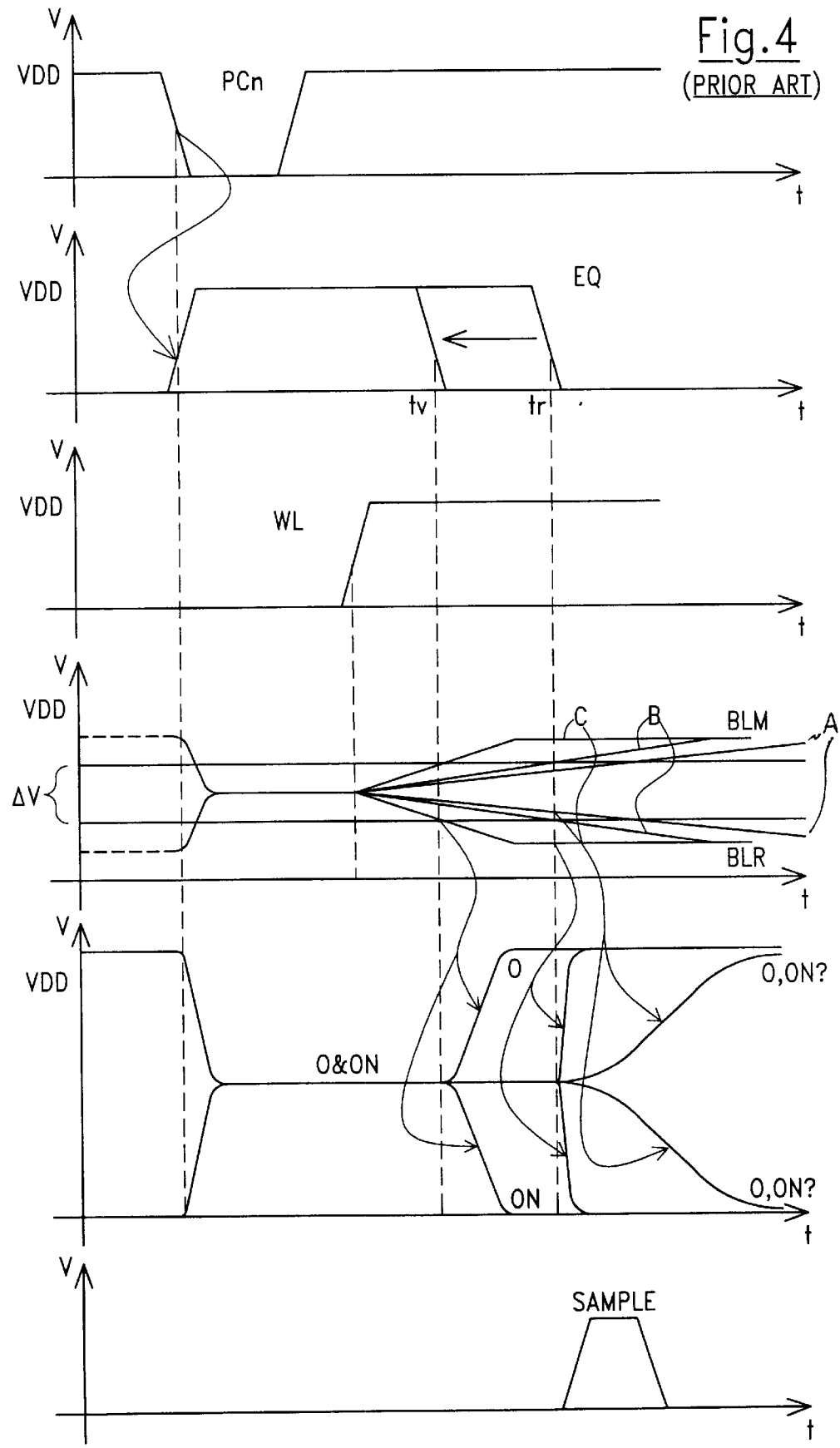
FIG. 4 is a timing diagram relating to the sensing circuit of FIG. 3 illustrating the method according to the present invention.

As shown in FIG. 4, the program verify method according to the invention provides for anticipating the time instant at which signal EQ is deactivated in program verify mode with respect to normal read mode; in the figure, tr is the instant at which signal EQ is deactivated in normal read mode, while tv is the instant at which signal EQ is deactivated in program verify mode. ΔV is an indecision voltage range for the latch structure of the sensing circuit shown in FIG. 2: if at the instant of deactivation of signal EQ the bit line potentials BLM, BLR fall within ΔV, the latch structure cannot reliably switch and store the correct datum. Curves A show the time evolution of the bit line potentials BLM, BLR in the case memory cell 1 is not sufficiently programmed to provide a correct reading either in normal reading conditions, or in program verify mode. Curves B show the time evolution of the bit line potentials BLM, BLR in the case the memory cell 1 has the minimum programming level sufficient to assure that, in normal reading conditions, it is read correctly. However, even such a memory cell is not reliable, because no security margins are provided; a slight increase of the supply voltage VDD (also due to noise), causing for example an anticipated deactivation of signal EQ, or slight charge losses on the part of said memory cell, would prevent a correct reading of the memory cell.

According to the method of the present invention, in order to program the memory cells with a prescribed security margin, after each programming pulse the memory cells are read by anticipating the time instant at which signal EQ is deactivated. Thus, a memory cell for which the bit line potentials BLM, BLR evolve according to curves B, when signal EQ is deactivated at instant tv is nor read correctly, because the bit line potentials still fall within the indecision voltage range ΔV of the latch structure. Thus, further programming pulses are applied to said memory cell at least until in program verify mode the bit line potentials BLM, BLR evolve according to curves C: in this case, even if signal EQ is deactivated at instant tv, the bit line potentials BLM, BLR fall outside the indecision voltage range ΔV, and the memory cell is read correctly; such a memory cell is programmed with a security margin sufficient to assure that, in normal reading conditions, the memory cell is read correctly even in presence of slightly higher voltage supply VDD, noise on the voltage supply or ground, slight charge losses in time, and so on.

It appears that, differently from the known program verify methods which provide for a static approach, the verifying method of the present invention is based on a dynamic approach: a memory cell is considered programmed with a sufficient security margin only if it is capable of being correctly read by the sensing circuit in a shorter time than that prescribed in normal reading conditions. Such a memory cell will thus surely be correctly read in normal reading conditions. The cell will be correctly read even if slight losses of charge on the part of the floating gate take place during time, as well as in other critical conditions.

Figure 1:
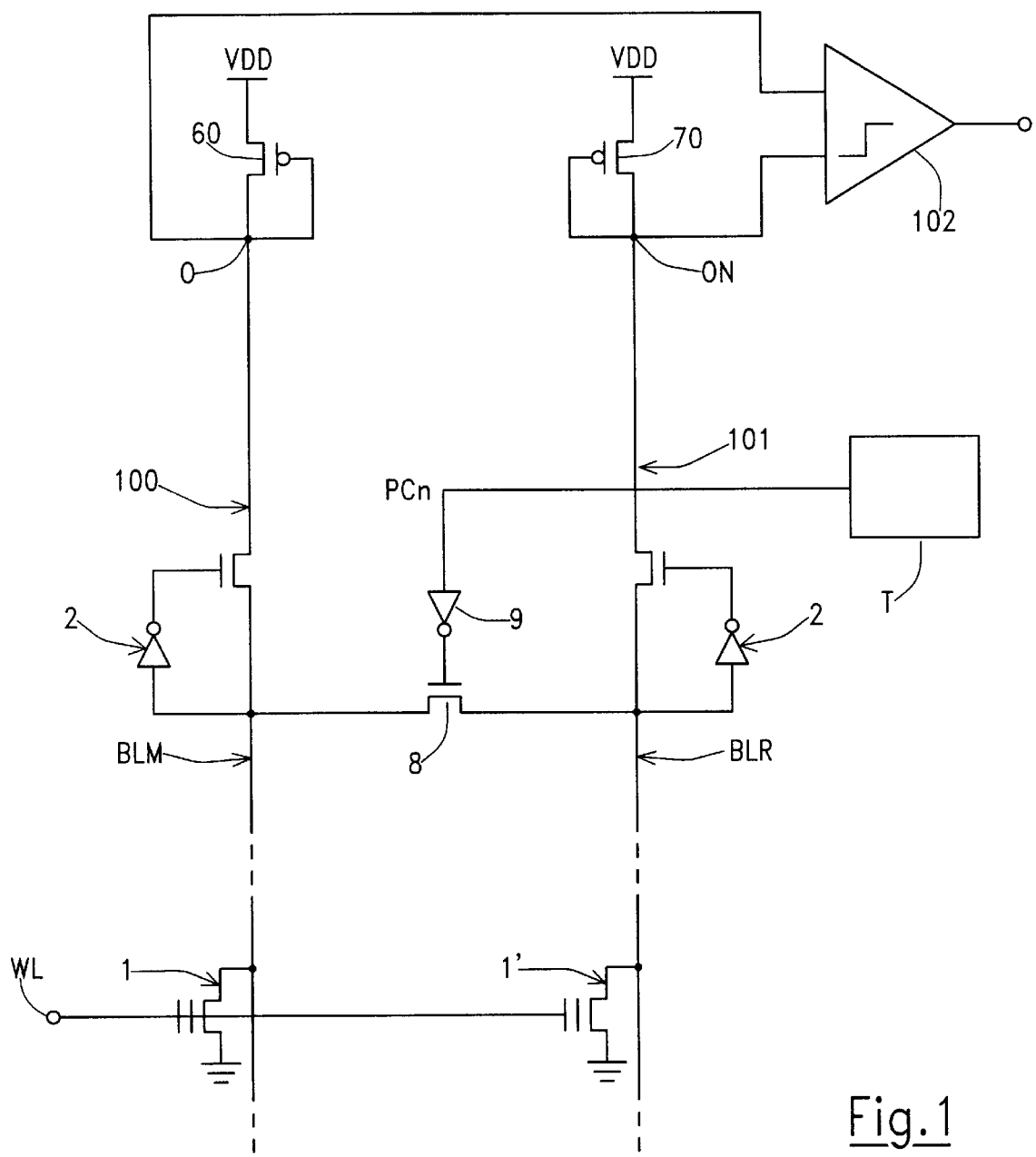
FIG. 1 is a circuit diagram of a known static memory cell sensing circuit.

As mentioned, the method of the present invention can be applied also to memory devices incorporating static sensing circuits of the type shown in FIG. 1 (i.e., memory devices not having an internal data sampling architecture): in this case, the problem of a memory cell not programmed with a security margin sufficient to provide a correct reading within the prescribed time is apparent at the output of the comparator 102 (or even at the output of the memory device). Using the known program verify methods, memory cells could be present which have a programming level sufficient to assure a correct reading only after a long time (i.e. in steady-state), but not within the prescribed access time of the memory device. According to the program verify method of the invention, in program verify mode the correctness of the datum at the output of the comparator 102 (or at the output of the memory device) is checked after a time shorter than the maximum time prescribed in normal reading conditions: if the datum read is not correct, the memory cell is applied further programming pulses until a correct datum is provided at the output within said shorter time interval. Checking is a known technique and can be accomplished by electronic instruments adapted for the purpose. These instruments include oscilloscopes, in the simplest case, and memory programmers used for programming EPROMs.

In the following, a preferred circuit structure suitable for actuating the method of the invention will be described.

Figure 5:
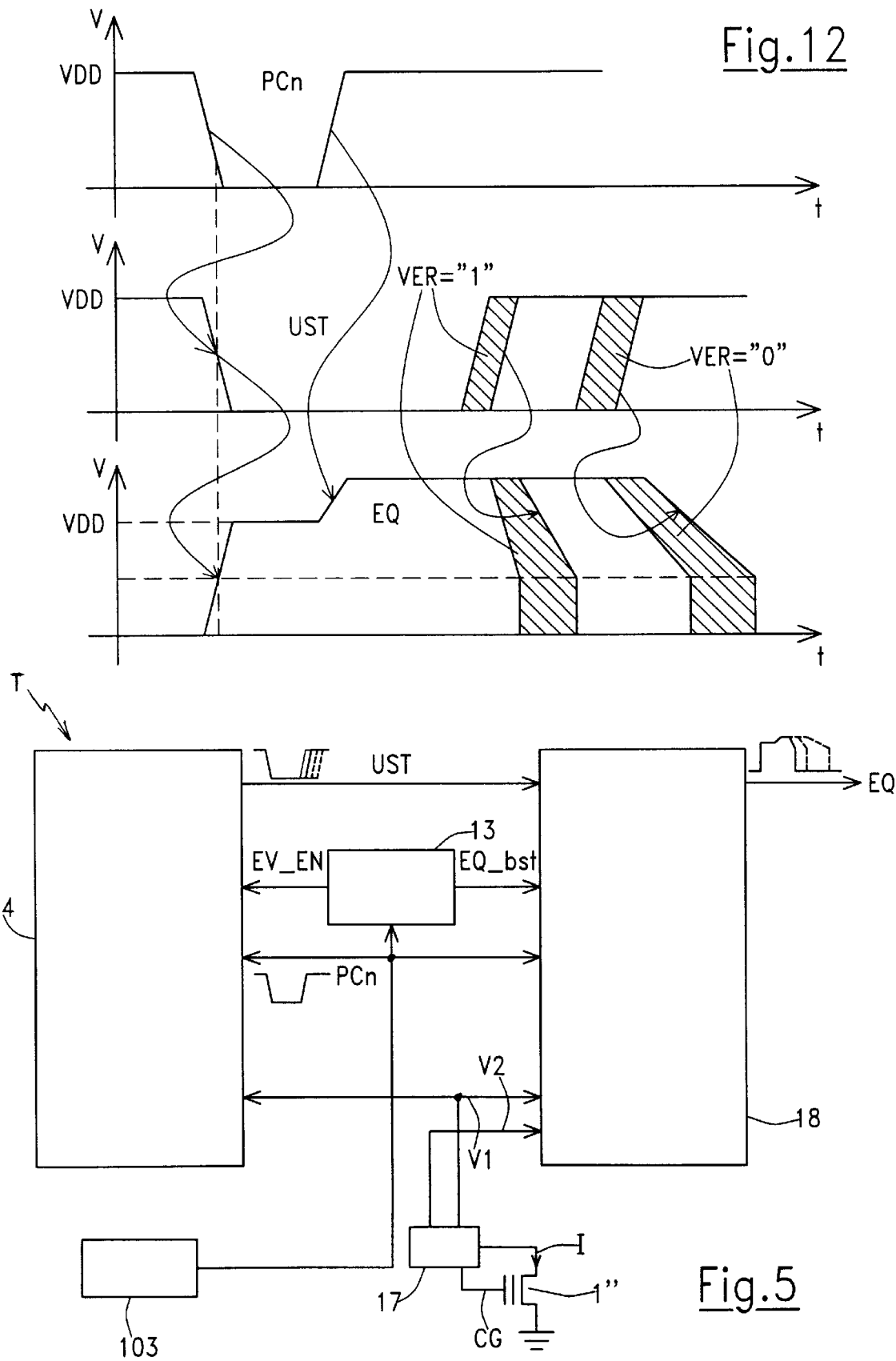
FIG. 5 is a schematic diagram of a timing circuit suitable for actuating the method of the invention.
Figure 6:
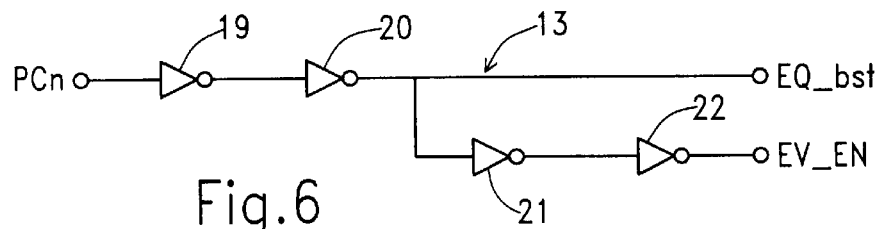
FIG. 6 is a circuit diagram of a first circuit block of the timing circuit of FIG. 5.

With reference to FIG. 5, a block diagram of the timing circuit T is shown. Signal PCn, generated in a conventional manner by a timing block 103 and activated when the memory device is accessed for reading its content, supplies a block 13, a block 14 and a block 18. Block 13, shown in detail in FIG. 6, generates two control signals EQ_bst and EV_EN, which are essentially the same as PCn, apart from respective slight activation delays. Signal EV_EN supplies block 14, and signal EQ_bst supplies block 18.

A voltage generator block 17 generates two analog voltage signals V1, V2; in the shown embodiment V1 supplies both block 14 and block 18, while V2 supplies block 18. V1 and V2 are analog voltages having respective values depending on a current I sunk by a transistor 1" identical to, and biased substantially in the same way as, the memory cells 1 and the reference memory cells 1'; as will be better described in the following, V1 has a high degree of correlation with current I, while V2 has a lesser degree of correlation with current I.

Block 14 produces an output signal UST corresponding to PCn, but having a longer time duration, variable according to the value of voltage V1 and thus to current I. Signal UST supplies block 18, which produces signal EQ; this has a time duration variable according to the time duration of signal UST (and thus to the value of current I); in addition to this signal EQ has a falling edge that, at least partially, has a slope variable according to the value of voltage V1 and consequently to the value of current I, as will be explained in detail later on.

Figure 7:
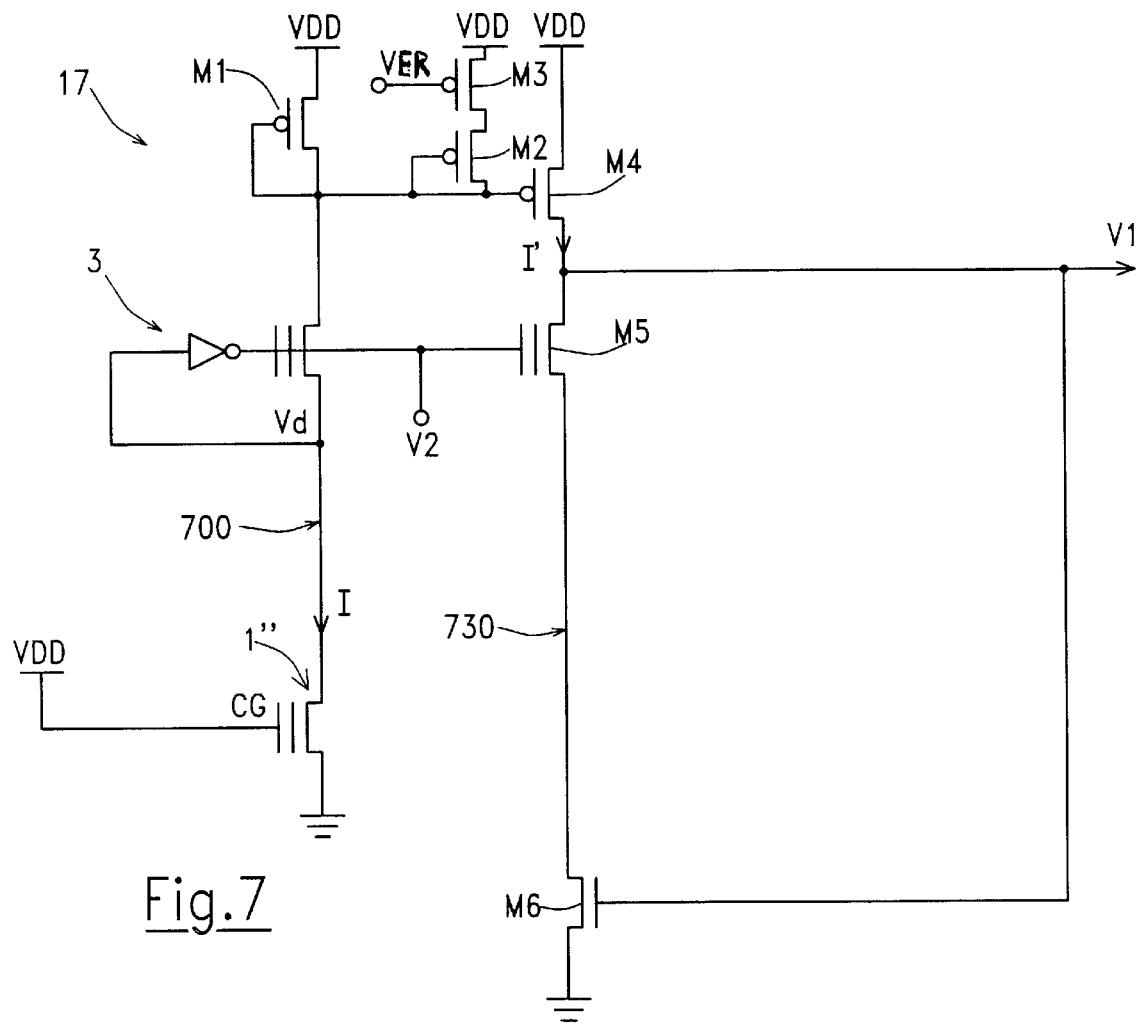
FIG. 7 is a circuit diagram of a second circuit block of the timing diagram of FIG. 5.

An embodiment of block 17 is shown in FIG. 7. The circuit comprises a current mirror network comprising a first circuit branch 700 wherein there are connected in series between VDD and ground a P-channel MOSFET M1 with gate tied to the drain, a voltage limiter 3 identical to those provided in the sensing circuit of FIG. 2, and the transistor 1". A second circuit branch 730 comprises, connected in series between VDD and ground, a P-channel MOSFET M4 with gate connected to the drain of M1, an N-channel MOSFET M5 controlled by the voltage limiter 3 and an N-channel MOSFET M6. In parallel to M1, a P-channel MOSFET M2 is provided with gate tied to the drain, in series to which a P-channel MOSFET M3 is connected which is controlled by a control signal VER which is activated (high logic level) during the program verify phase.

In normal reading conditions, signal VER is deactivated (low logic level), so that MOSFET M3 is on. The current I sunk by transistor 1" flows through MOSFETs M1 and M2, M3, and a current I' proportional to current I is mirrored in the second circuit branch 730. Current I' is equal to:

$$I'=I*K4/(K1+K2)$$

where K1, K2 and K4 are the aspect ratios of MOSFETs M1, M2 and M4, respectively. Current I' flows through M6, so that voltage V1, i.e. the gate voltage of M6, sets to a value suitable to allow M6 sustain current I'; since M6 works in the linear region and its drain-to-source voltage is kept constant by M5 controlled by the voltage limiter 3, V1 is a linear function of I, with a proportionality factor depending on the aspect ratios K1, K2 and K4.

Thus, voltage V1 depends on the value of current I sunk by transistor 1", that tracks the conductivity of the memory cells 1 and the reference memory cell 1'.

In program verify operating conditions, signal VER is activated, and M3 is kept off. The current I' mirrored in circuit branch 730 is thus equal to:

$$I' = I \ast K4/K1$$

i.e., for a given value of I, I' is higher in program verify than in normal reading conditions; consequently, for each value of current I V1 is higher in program verify conditions than in normal reading conditions.

Figure 8:
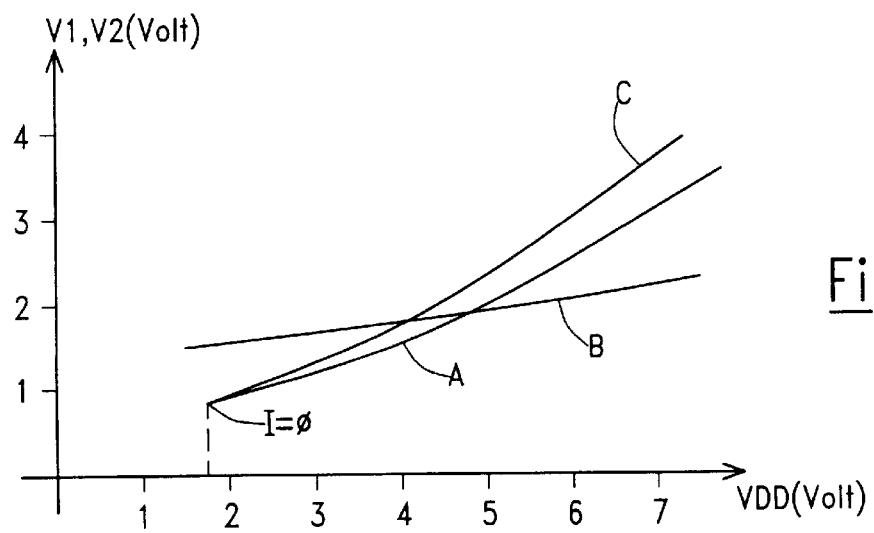
FIG. 8 is a diagram showing the dependence of signals generated by the second circuit block on a voltage supply.

In FIG. 8 curve A shows the dependence of V1 on VDD in normal reading conditions (VER="0"), curve C shows the dependence of V1 on VDD in program verify conditions (VER="1") and curve B shows the dependence of V2 on VDD in both conditions. It appears that in both cases V1 has a substantially linear dependence on VDD, while V2 has a lesser dependence on VDD.

Figure 9:
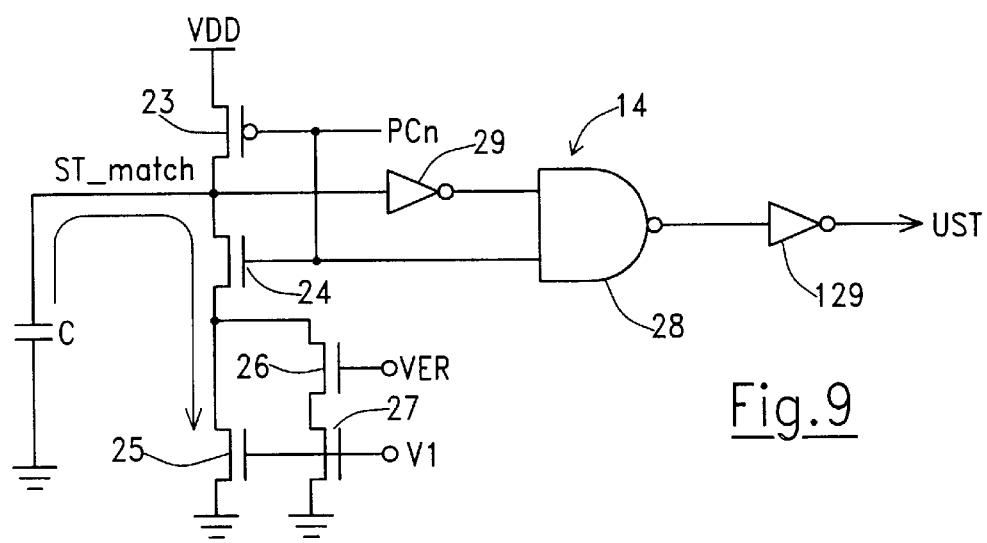
FIG. 9 is a circuit diagram of a third circuit block of the circuit of FIG. 5.

FIG. 9 shows the circuit structure of an embodiment of block 14 of FIG. 5. The circuit comprises a capacitor C with one plate connected to ground and the other plate connected to the drain of a P-channel MOSFET 23 with source connected to VDD and gate supplied with signal PCn. In series to the drain of MOSFET 23 there is connected an N-channel MOSFET 24 also controlled by PCn, and in series thereto an N-channel MOSFET 25 is provided with source connected to ground and gate supplied by V1. In parallel to MOSFET 25 a series connection of N-channel MOSFETs 26 and 27 is provided, the former controlled by signal VER and the latter having gate supplied by signal V1. Signal PCn also supplies an input of a NAND gate 28 whose other input is supplied, through an inverter 29, by a signal ST_match forming the drain potential of MOSFET 23. The output of NAND 28 supplies an inverter 129 whose output is the signal UST shown in FIG. 5.

Figure 10:
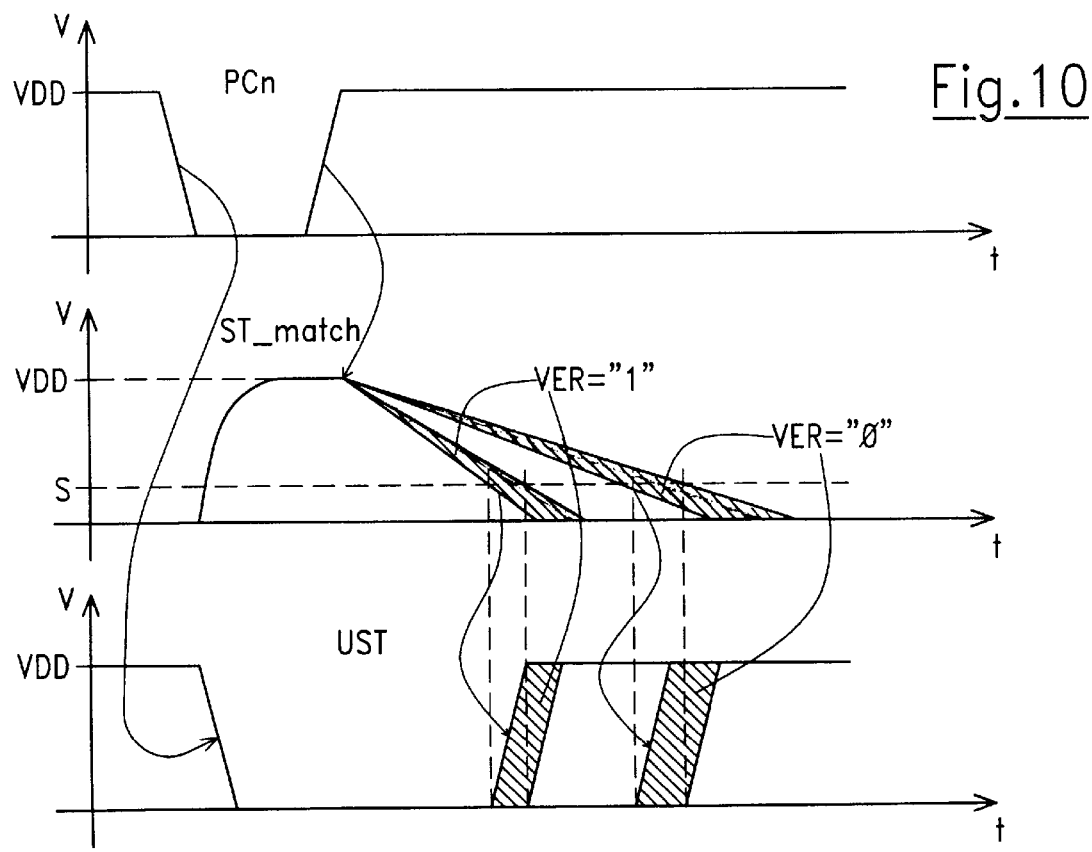
FIG. 10 is a timing diagram of signals generated by said third circuit block.

Referring to the time diagrams of FIG. 10, at the beginning of a read operation of the memory device signal PCn goes low. MOSFET 23 turns on while MOSFET 24 turns off. Consequently, signal UST goes low. Capacitor C charges through MOSFET 23 and signal. ST_match rises exponentially towards VDD. When signal PCn returns high, MOSFET 23 turns off and MOSFET 24 turns on. In normal reading conditions, signal VER is deactivated (low logic level), so that capacitor C discharges through MOSFET 25 only; such a discharge takes place at a constant current, said current depending on the value of voltage V1, i.e. on the value of current I sunk by transistor I". The discharge time of capacitor C thus varies according to the conductivity of transistor 1", which is identical to and operates in the same conditions as the memory cells. Thus, the discharge time of capacitor C tracks the conductivity of the memory cells 1 and the reference memory cell 1'. When signal ST_match falls below the trigger level S of inverter 29, signal UST goes high; as visible, the time duration of signal UST is not fixed, but varies according to the conductivity of transistor 1", i.e. of the memory cells.

In program verify conditions, signal VER is activated (high logic level), and the discharge of capacitor C takes place through MOSFETs 25 and 27. The discharge time of capacitor C is thus shorter, and the time duration of signal UST, again depending on the conductivity of transistor 1", is shorter than in normal reading conditions. It already appears that in program verify conditions the timing of signal UST is accelerated with respect to normal reading conditions, both because the value of voltage V1 is higher (FIG. 8) and because the discharge of capacitor C takes place through MOSFETs 25 and 27 in parallel.

Figure 11:
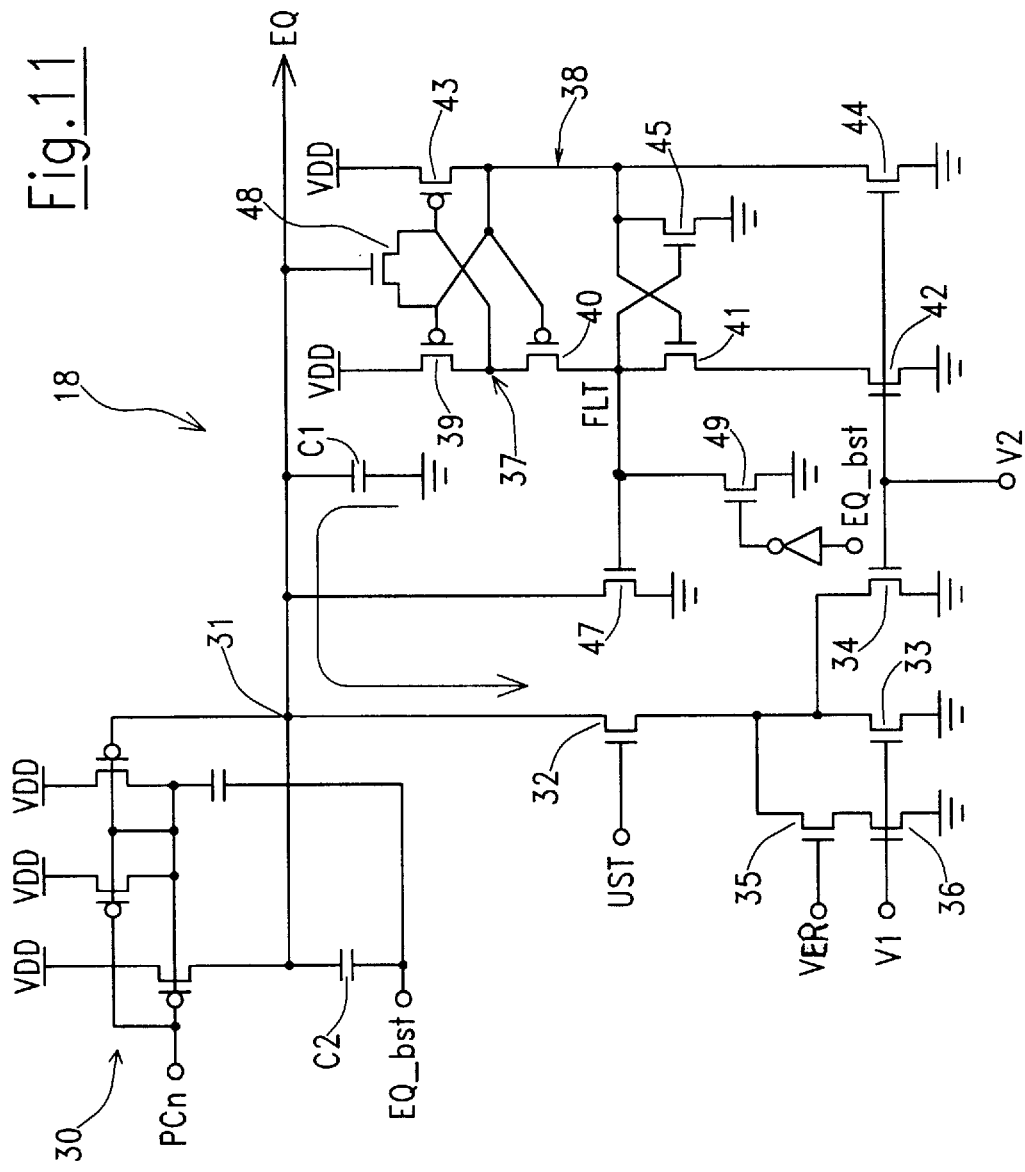
FIG. 11 is a circuit diagram of a fourth circuit block of the circuit of FIG. 5.

FIG. 11 shows the circuit diagram of an embodiment of block 18 of FIG. 5. The circuit comprises a voltage boosting network 30, driven by signals PCn and EQ_bst, for generating a voltage higher than the supply voltage VDD at a node 31 to which signal EQ is connected. A capacitor C1 is connected between node 31 and ground. A discharge circuit for discharging capacitor C1 is further connected between node 31 and ground, the discharge circuit comprising an N-channel MOSFET 32 controlled by signal UST and, in series thereto, an N-channel MOSFET 33 controlled by voltage V1. In parallel to MOSFET 33 there are connected an N-channel MOSFET 35 controlled by signal VER and, in series thereto, an N-channel MOSFET 36 controlled by voltage V1. Also, in parallel to MOSFET 33 there is connected an N-channel MOSFET 34 controlled by voltage V2. The circuit further comprises a network substantially identical to the load network of the sensing circuit of FIG. 2, i.e. a circuit comprising two branches 37 and 38. Branch 37 comprises, in series between VDD and ground, P-channel MOSFETs 39 and 40 and N-channel MOSFETs 41 and 42. Branch 38 comprises, in series between VDD and ground, a P-channel MOSFET 43 and an N-channel MOSFET 44. The gate of MOSFET 43 is connected to the drain of MOSFET 39, and similarly the gate of MOSFET 39 is connected to the drain of MOSFET 43. The gate of MOSFET 41 is connected to the drain of MOSFET 43; an N-channel MOSFET 45 is connected between the drain of MOSFET 43 and ground, and has the gate connected to the drain of MOSFET 40. The gates of MOSFETs 42 and 44 are controlled by voltage V2. The drain of MOSFET 40 further controls an N-channel MOSFET 47 connected between node 31 and ground. An N-channel MOSFET 48 is inserted between the gates of MOSFETs 39 and 43, and has the gate controlled by signal EQ. Between node FLT and ground there is inserted an N-channel MOSFET 49 controlled by a signal which is the logic complement of signal EQ_bst.

Referring to FIG. 12, when at the beginning of a read operation signal PCn goes low, signal EQ_bst goes low. A boosting capacitor C2 has one plate connected to node 31 and the other plate connected to signal EQ_bst. When signal EQ_bst goes low, boosting capacitor C2 charges to VDD. Signal UST goes low and turns MOSFET 32 off, interrupting the discharge path of capacitor C1. When signals PCn and EQ_bst return to the high logic level the potential of node 31 rises beyond VDD. In this way, MOSFET 12 in the sensing circuit of FIG. 2 is overdriven and assures a good short-circuit between nodes O and ON, even in presence of body effect due to the high operating point of the nodes O and ON. The same reasoning holds true for MOSFET 48, that assures a good short-circuit between branches 37 and 38. Also, as long as signal EQ_bst is activated, MOSFET 47 is kept off.

After a time delay that as already described depends on the conductivity of transistor 1", signal UST goes high turning MOSFET 32 on and enabling the discharge path for capacitor C1. In normal reading conditions, signal VER is deactivated and capacitor C1 discharges through MOSFETs 33 and 34. The discharge of capacitor C1 takes place at a constant current whose value depends on the conductivity of transistor 1". As the potential of node 31 falls toward ground, MOSFET 48 becomes less conductive, and the short-circuit between branches 37, 38 less effective. As long as MOSFET 48 keeps the gates of MOSFET 39 and 43 short-circuited, MOSFET 40 is off because its gate potential is approximately equal to VDD minus the threshold voltage of MOSFET 39. No current flows in branch 37. The fall of the potential of node 31 makes the short-circuit of the gates of MOSFETs 39 and 43 less effective, and MOSFET 40 starts turning on, so that a current starts flowing through branch 37; the value of such current depends on the value of voltage V2 biasing MOSFET 42. It is to be noted that, by construction, the potentials of branches 37 and 38 are respectively equal to the potentials of nodes O and ON of the sensing circuit of FIG. 2. The potential of branch 38 falls below that of branch 37 due to the decoupling action of MOSFET 40. As a result, the potential of node FLT raises, because the fall of the potential of branch 38 and the corresponding rise of the potential of branch 37 make MOSFET 40 to turn on. The feedback action of MOSFET 45 makes the fall of the potential of branch 38 more rapid. Before the potential of node FLT reaches the threshold voltage of MOSFET 47, the potential of node 31 (and thus signal EQ) falls linearly with a slope depending on the discharge current of capacitor C1, i.e. on the values of voltages V1 and V2. When the potential of node FLT reaches the threshold voltage of MOSFET 47, the latter turns on .and signal EQ falls rapidly to ground. Thus, the falling edge of signal EQ has two different slopes. The change in slope takes place as soon as the potential difference between branches 37 and 38 is equal to the threshold voltage of MOSFET 40; this simulates the condition in the sensing circuit of FIG. 2 that the potential difference between nodes O and ON is sufficient to guarantee a correct reading of the memory cells.

It appears that signal EQ not only has a time duration variable according to the conductivity of the memory cells, but also a falling edge with a steep gradient which, at least initially, depends on the conductivity of the memory cells. In this way, the sensitivity of the sensing circuit of FIG. 2 can be modulated according to the conductivity of the memory cells.

In program verify conditions, signal VER is high and the discharge path of capacitor C1 also comprises MOSFET 36; the discharge current of capacitor C1 is thus higher in program verify conditions than in normal reading conditions. Consequently, not only the time duration of signal EQ (determined by signal UST) is shorter, but also the slope of the falling edge of signal EQ is higher than in normal reading conditions. So, the reading conditions of the memory cells in program verify are made worse than during a normal reading, so that memory cells not programmed with a sufficient security margin do not pass the test and are submitted to further programming pulses.

The circuit described thus allows to anticipate the time instant at which signal EQ is deactivated in program verify conditions with respect to normal reading conditions, thus allowing to implement the method of the present invention. Furthermore, the circuit described allows to vary both the time duration and the slope of the falling edge of signal EQ according to the conductivity of the memory cells, and this both in normal reading conditions and in program verify conditions.

Other circuit embodiments can be used to implement the method of the present invention. For example, it is not strictly necessary that the timing of signal EQ be dependent on the conductivity characteristics of the memory cells.

Also, it would be possible not to vary the slope of the falling edge of signal EQ according to the conductivity characteristics of the memory cells. Another possibility is to avoid the use of circuit block 14 in FIG. 5, because the timing of signal EQ can be varied by block 18 only; in alternative to this, block 18 can be eliminated, and only block 14 can be used to vary the timing of signal EQ. A further possibility, in case both block 14 and 18 are provided, is to modify the behaviour of only one of these two blocks in program verify mode.

The circuit structure described hereinabove is suitable for implementing the program verify method of the invention for a sensing circuit of the type shown in FIG. 2. However, it is straightforward to the skilled person to modify the circuit described above in order to implement the method of the invention for other kinds of sensing circuits, for example the static sensing circuit shown in FIG. 1.

I claim:

1. Method for verifying an electrically programmable non-volatile memory cell of an electrically programmable memory device after programming, providing for accessing the memory cell after having submitted the same to at least a programming pulse by means of a sensing circuit, checking an output of the sensing circuit, and submitting said memory cell to further programming pulses if said output of the sensing circuit corresponds to a non-programmed memory cell, characterized in that said checking an output of the sensing circuit is performed at a first instant of time which is anticipated of a prescribed time interval with respect to a second instant of time at which said output of the sensing circuit is checked in a normal read operation of the memory device, said prescribed time interval corresponding to a prescribed security margin of programming of the memory cell.

2. Method according to claim 1, characterized in that said accessing the memory cell provides for pre-setting a potential of a respective column of memory cells to which said memory cell belongs and selecting a row of memory cells to which said memory cell belongs.

3. Method according to claim 2, characterized by providing for comparing a current sunk by said memory cell with a reference current sunk by a reference memory cell in a prescribed programming state.

4. Method according to claim 3, characterized in that said reference memory cell is a non-programmed memory cell.

5. Method according to claim 4, characterized in that said accessing the memory cell also provides for pre-setting a potential of a reference column of reference memory cells, said reference memory cell belonging to said row of memory cells to which said memory cell belongs.

6. Method according to claim 5, characterized in that said column of memory cells and said reference column of reference memory cells are pre-set at a same potential.

7. Method according to any one of the preceding claims, characterized in that said checking an output of the sensing circuit comprises memorizing said output at said first instant of time instead of at said second instant of time.

8. Method according to any one of the preceding claims, characterized in that said first instant of time and said second instant of time varies according to a conductivity of said memory cell.

9. Method according to claim 8, characterized in that said prescribed time interval depends on the conductivity of said memory cell.

10. Method according to claim 9, characterized in that said prescribed time interval is longer the higher the conductivity of said memory cell.

11. A method for verifying an electrically programmable non-volatile memory cell of an electrically programmable memory device after programming, the method comprising the steps of:

(a) submitting the memory cell to one or more programming pulses;

(b) checking an output of the memory cell at a first instant of time that is a prescribed time interval before a second instant of time at which the output of the memory cell is checked in a normal read operation of the memory device; and (c) submitting the memory cell to further programming pulses if the output of the memory cell corresponds to the output of a non-programmed memory cell.

12. The method of claim 11, wherein the step of checking includes the further steps of:
   (a) presetting a potential of a respective column of memory cells to which the memory cell belongs; and
   (b) selecting a row of memory cells to which the memory cell belongs.

13. The method of claim 12, wherein the step of checking includes comparing a current sunk by said memory cell with a reference current sunk by a reference memory cell in a prescribed programmed state.

14. The method of claim 13, wherein the reference memory cell is a non-programmed memory cell.

15. The method of claim 14, wherein the step of checking the output of the memory cell includes the step of presetting a potential of a reference column of reference memory cell wherein the reference memory cell belongs to the row of memory cells to which the memory cell belongs.

16. The method of claim 15 wherein the column of memory cells and the reference column of reference memory cells are preset at the same potential.

17. The method of claim 11, wherein the step of checking the output of the memory cell comprises storing the output at the first instant of time instead of at the second instant of time.

18. The method of claim 11, wherein the first instant of time and the second instant of time vary according to a conductivity of the memory cell.

19. The method of claim 18, wherein the prescribed time interval depends on the conductivity of the memory cell.

20. The method of claim 19, wherein the prescribed time interval is longer the higher the conductivity of the memory cell.

21. Apparatus for verifying an electrically programmable non-volatile memory cell of an electrically programmable memory device after programming, comprising:
   (a) a generator of voltage pulses for submitting the memory cell to one or more programming pulses;
   (b) electrical instrumentation for checking an output of the memory cell at a first instant of time that is a prescribed time interval before a second instant of time at which the output of the memory cell is checked in a normal read operation of the memory device; and
   (c) a generator of voltage pulses for submitting the memory cell to further programming pulses if the output of the memory cell corresponds to the output of a non-programmed programmed memory cell.

22. Apparatus of claim 21, wherein electrical instrumentation for checking includes:
   (a) a voltage source for presetting a potential of a respective column of memory cells to which the memory cell belongs; and
   (b) electrical instrumentation for selecting a row of memory cells to which the memory cell belongs.

23. Apparatus of claim 22, wherein electrical instrumentation for checking includes a comparator for comparing a current sunk by the memory cell with a reference current sunk by a reference memory cell in a prescribed programmed state.

24. Apparatus of claim 23, wherein the reference memory cell is a non-programmed memory cell.

25. Apparatus of claim 24, wherein electrical instrumentation for checking the output of the memory cell includes means of pre-setting a potential of a reference column of reference memory cell wherein the reference memory cell belongs to the row of memory cells to which the memory cell belongs.

26. Apparatus of claim 25 wherein the column of memory cells and the reference column of reference memory cells are preset at the same potential.

27. Apparatus of claim 21, wherein electrical instrumentation for checking the output of the memory cell comprises storing the output at the first instant of time instead of at the second instant of time.

28. Apparatus of claim 21, wherein the first instant of time and the second instant of time vary according to a conductivity of the memory cell.

29. Apparatus of claim 28, wherein the prescribed time interval depends on the conductivity of the memory cell.

30. Apparatus of claim 29, wherein the prescribed time interval is longer the higher the conductivity of the memory cell.

31. A circuit for verifying electrically programmable non-volatile memory cells of an electrically programmable non-volatile memory device after programming, including:
   (a) a voltage source for submitting the memory cell to one or more programming pulses;
   (b) a sensing circuit for accessing the status of the memory cell;
   (c) a timing signal generator for generating a timing signal at a time that is a prescribed time interval before the time at which the output of the sensing circuit is checked in a normal read operation of the memory device; and
   (d) a voltage source for submitting the memory cell to further programming pulses if the output of the sensing circuit corresponds to the output of a non-programmed memory cell.

32. The timing generator of claim 31, comprising:
   (a) a timing block that generates a precharge signal;
   (b) a control signal generator that receives the precharge signal and generates two control signals similar to the precharge signal except for slight activation delays;
   (c) a voltage generator that generates two analog voltages with values depending upon current sunk by a transistor identical to and biased substantially the same way as the memory cell and a reference memory cell;
   (d) an intermediary timing circuit that receives the precharge signal, one of the control signals, and one of the analog voltages and generates an intermediary time signal similar to the precharge signal but having longer duration, variable according to one of the analog voltages; and
   (e) a final timing circuit that receives the precharge signal, the two analog voltages, one of the two control signals, and the intermediary time signal and generates the timing signal that has a time duration variable according to the time duration of the intermediary time signal and a falling edge with a slope at least partially variable according to the value of one of the analog voltages.

33. The circuit of claim 31, where the timing signal initiates equalizing voltages of a bit line attached to a memory cell and a bit line attached to a reference memory cell.

34. The circuit of claim 31, where the timing signals initiate storage of the memory cell bit line voltage and the reference memory cell bit line voltage.

35. The circuit of claim 31 where the memory cell bit line voltage and the reference memory cell bit line voltages are stored in a latch.

36. The circuit of claim 35 wherein a comparator receives voltages stored in the latch and generates an output voltage which is one value if the memory cell voltage is larger than the reference memory cell voltage and another value if the reference memory cell voltage is larger than the memory cell voltage.

37. The circuit of claim 36 including means for measuring the output voltage of the comparator.

38. The circuit of claim 37 wherein the means for measuring the output voltage of the comparator includes an oscilloscope.

39. The circuit of claim 37 wherein the means for measuring the output voltage of the comparator includes a memory programmer.

40. The circuit of claim 31 wherein the means for generating the time signals can be modulated according to the conductivity of the memory cells.

* * * * *